(12) United States Patent
Hussain et al.

(10) Patent No.: US 11,855,001 B2
(45) Date of Patent: Dec. 26, 2023

(54) LEADLESS LEADFRAME AND SEMICONDUCTOR DEVICE PACKAGE THEREFROM

(71) Applicant: Texas Instruments Incorporated, Dallas, TX (US)

(72) Inventors: Mohammad Waseem Hussain, Irving, TX (US); David Taiwai Chin, Cupertino, CA (US); Dorothy Lyou Mantle, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/089,372

(22) Filed: Nov. 4, 2020

(65) Prior Publication Data
US 2022/0139847 A1 May 5, 2022

(51) Int. Cl.
| | | |
|---|---|---|
| *H01L 23/31* | (2006.01) | |
| *H01L 23/495* | (2006.01) | |
| *H01L 21/56* | (2006.01) | |
| *H01L 21/48* | (2006.01) | |
| *H01L 23/00* | (2006.01) | |

(52) U.S. Cl.
CPC ........ *H01L 23/562* (2013.01); *H01L 21/4825* (2013.01); *H01L 21/4828* (2013.01); *H01L 21/4842* (2013.01); *H01L 21/565* (2013.01); *H01L 23/3114* (2013.01); *H01L 23/4952* (2013.01); *H01L 23/49503* (2013.01); *H01L 23/49541* (2013.01)

(58) Field of Classification Search
None
See application file for complete search history.

(56) References Cited

U.S. PATENT DOCUMENTS

| | | | | |
|---|---|---|---|---|
| 6,025,640 | A * | 2/2000 | Yagi | H01L 21/4828 257/666 |
| 7,714,415 | B2 * | 5/2010 | Kim | H01L 23/49503 257/666 |
| 9,269,690 | B2 * | 2/2016 | Groenhuis | H01L 24/05 |
| 9,589,868 | B2 * | 3/2017 | Mcknight-Macneil | H01L 23/49575 |
| 9,601,415 | B2 * | 3/2017 | Makino | H01L 21/50 |
| 9,824,959 | B2 * | 11/2017 | Milo | H01L 21/4853 |
| 10,229,871 | B2 * | 3/2019 | Ookawauchi | H01L 23/49541 |
| 10,304,759 | B2 * | 5/2019 | Lam | H01L 23/49541 |
| 10,825,754 | B2 * | 11/2020 | Wang | H01L 21/4828 |
| 2007/0252247 | A1 * | 11/2007 | Kim | H01L 23/49503 257/666 |

(Continued)

*Primary Examiner* — Bo B Jang
(74) *Attorney, Agent, or Firm* — Yudong Kim; Frank D. Cimino

(57) ABSTRACT

A semiconductor device package includes a leadless leadframe, and a plurality of terminal pads extending to a periphery of the leadframe. At least two of the plurality of terminal pads are interior extending terminal pads that include an interior portion having a shape including at least one curved portion and an exterior portion that extends to the periphery of the leadframe. An integrated circuit (IC) die having at least a semiconductor surface includes circuitry configured for at least one function having nodes connected to bond pads on the leadframe. There is a bonding arrangement between the plurality of terminal pads and the bond pads. A mold compound is for encapsulation of the semiconductor device package.

38 Claims, 4 Drawing Sheets

(56) References Cited

U.S. PATENT DOCUMENTS

| | | | |
|---|---|---|---|
| 2015/0162298 A1* | 6/2015 | Groenhuis | H01L 23/4951 |
| | | | 257/773 |
| 2016/0254214 A1* | 9/2016 | Makino | H01L 24/32 |
| | | | 257/676 |
| 2016/0268190 A1* | 9/2016 | Mcknight-Macneil | |
| | | | H01L 21/78 |
| 2017/0053855 A1* | 2/2017 | Lam | H01L 21/561 |
| 2017/0278776 A1* | 9/2017 | Milo | H01L 23/293 |
| 2018/0040539 A1* | 2/2018 | Wang | H01L 23/49541 |
| 2018/0166368 A1* | 6/2018 | Ookawauchi | H01L 23/49582 |

\* cited by examiner

LEADLESS LEADFRAME AND SEMICONDUCTOR DEVICE PACKAGE THEREFROM

FIELD

This Disclosure relates to leadless leadframes and leadless semiconductor device packages.

BACKGROUND

Flat no-lead packages include quad-flat no-lead (QFN) and dual-flat no-lead (DFN) packages that physically and electrically connect integrated circuits (ICs) to printed circuit boards (PCBs). Flat no-leads packages are also known as a micro leadframe (MLF) and SON (small-outline nolead) packages, comprise a surface-mount technology, one of several package technologies that connect ICs to the metal pads on the surfaces of PCBs without the need for through-holes. Flat no-lead is a near-chip scale plastic encapsulated package generally made with a planar copper leadframe substrate. Perimeter terminal pads (also known as I/O pads or lands) on the bottom of the package provide electrical connections to the metal pads on the PCB. Flat no-lead packages generally include an exposed thermally conductive pad (e.g., copper) which improves the heat transfer out from the IC to the PCB.

Semiconductor device no-lead packages need a higher pin density to use less board space and lower the package costs. Traditional QFN packages use rectangular-shaped terminal pads that are all positioned only around the periphery of the package. Cost is directly related to the package size through assembly efficiency of leadframe strip (or panel) processing and material usage.

IC die sizes are generally decreasing over time so that the package sizes also need to follow this size reducing trend. There is thus a recognized need for a higher pin density for leadless packages, such as QFN packages, where each terminal pad may be connected to a pin of the package. QFN packages can be configured as wirebond packages or as flipchip packages. Known approaches for obtaining higher pin density for leadless packages include a molded interconnect substrate (MIS) approach, using a smaller pitch for the terminal pads which as described above are generally rectangular-shaped and positioned only on the perimeter of the package, and a multi-row QFN for providing higher pin counts.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects solve the unmet need for leadless packages of smaller area and/or higher pin density to reduce the costs, such as for QFN packages, including because of the semiconductor industry movement towards smaller IC die sizes. Disclosed aspects provide a leadless leadframe including interior extending terminal pads that comprise an interior portion having a shape including at least one curved portion, and an exterior portion that extends to the periphery of the leadframe, and a semiconductor device package including a disclosed leadframe.

The term 'interior extending terminal pads' is used herein because disclosed terminal pads not only include an interior portion configured for an IC die to be placed on but also include an exterior portion that reaches a periphery of the leadframe, where the exterior portion is configured for wirebonding to in the case of a wirebond package. In the case of a flipchip package arrangement, the use of the interior portion and the exterior portion of disclosed interior extending terminal pads is technically almost the same as for a wirebond package, with the exterior portion again extending to the outer edge of the package. However, for flipchip a disclosed leadframe is more flexible compared to a leadframe for a leading package since there is no need to allocate a space for wirebond placement.

Disclosed aspects include a disclosed leadless leadframe including a plurality of terminal pads extending to a periphery of the leadframe. At least two of the plurality of terminal pads comprise interior extending terminal pads that include an interior portion having a shape including at least one curved portion and an exterior portion that extends to the periphery of the leadframe. Disclosed aspects also include a semiconductor device package including an IC die attached to a disclosed leadframe.

Disclosed interior extending terminal pads having an interior portion with a shape including at least one curved portion thus having a non-regular/non-polygon shape are distinct from conventional terminal pads which have a polygon-shape and thus have only straight sides, which are generally triangular or square/rectangular in shape. Because disclosed terminal pads have an interior portion with a non-regular shape including at least one curved portion, this better utilizes the area of the package to provide a higher pin density. Disclosed interior extending terminal pads enable easier wirebonding in the case of a wirebond package and better manufacturing tolerances (e.g., for IC die placement, and leadframe (LF) etching). Other advantages include better pin density and therefore lower cost. There is also provided a more solderable area for solder mount processing, such as for soldering to a PCB by the customer at their assembly location.

BRIEF DESCRIPTION OF THE DRAWINGS

Reference will now be made to the accompanying drawings, which are not necessarily drawn to scale, wherein.

DETAILED DESCRIPTION

Figure 1A:
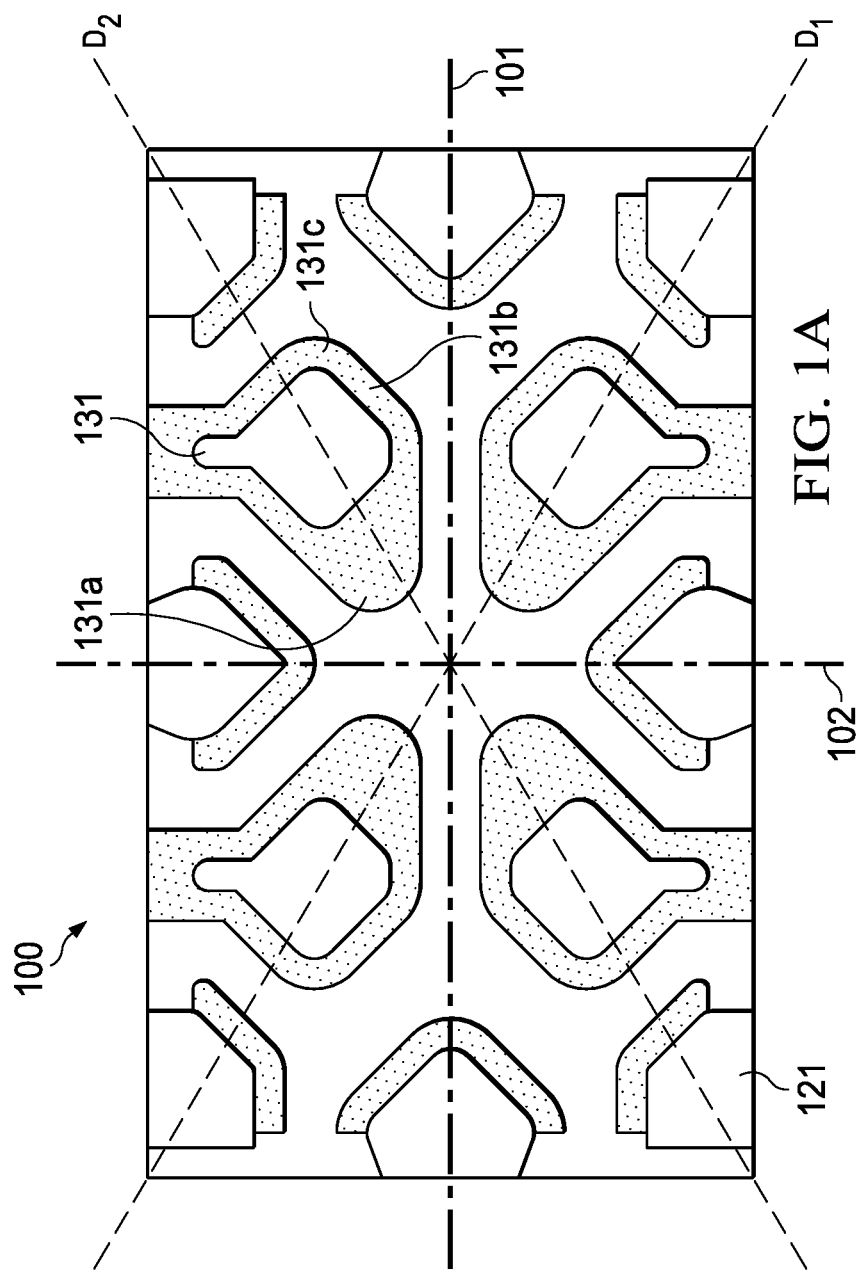
FIG. 1A is a cross-sectional view of an example 12 pin leadless leadframe showing the terminal pads including both exterior terminal pads numbering 8 in total including an identified terminal pad, where each of the 12 terminal pads have full thickness and half-etched portions, according to an example aspect. The inner extending terminal pads are not positioned along either of the centerlines but are all instead shown having a portion along a diagonal of the leadframe.

Example aspects are described with reference to the drawings, wherein like reference numerals are used to designate similar or equivalent elements. Illustrated ordering of acts or events should not be considered as limiting, as some acts or events may occur in a different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a cross-sectional view of an example 12 pin leadless leadframe showing the terminal pads including both exterior terminal pads numbering 8 in total including an identified terminal pad identified as 121 shown as a conventional terminal pad and inner extending terminal pads numbering 4 in total including an identified disclosed interior extending terminal pad as 131, according to an example aspect. The interior extending terminal pads including interior extending terminal pad as 131 can be seen to include at least one curved portion, with these disclosed terminal pads shown including a first curved portion and a second curved portion separated from one another by a straight portion. For the interior extending terminal pad 131 the first curved portion is identified as 131a, the second curved portion is identified as 131c, and the straight portion between the first curved portion 131a and the second curved portion 131c is identified as 131 b. The interior extending terminal pads can be seen to have a larger area as compared to others of the plurality of terminal pads.

Disclosed interior extending terminal pad such as interior extending terminal pad 131 shown in FIG. 1A having an interior portion with a non-regular shape including at least one curved portion shown as 131a, 131c may be contrasted with interior polygon-shaped terminal pads that may be either square or rectangular in shape which generally comprise at least one of equilateral (square-shaped, where all sides of the terminal pad are the same length) or equiangular (rectangular-shaped, where all angles between the sides are of the same measure, thus being equiangular typically at a 90° angle). The disclosed interior portion having a shape including at least one curved portion can also maintain a predetermined minimum metal-to-metal spacing requirement, meet minimum solder stencil aperture requirements, and are generally at least one of equally offset from at least one centerline of the leadframe, or are placed along the diagonal of the leadframe.

Each of the 12 terminal pads is shown having full thickness portions and half-etched portions, with the half-etched portions shown with a dot pattern. For the interior extending terminal pads including the inner extending terminal pad 131 the half-etched regions are shown completely encircling a full thickness region.

Half-etching is used to provide half-etched portions which allows the top side assembly to work with an area that is not visible after molding to the customer. The solder mount process, typically the Customer's solder mount process, generally needs to maintain a predetermined minimum clearance between the respective metal terminals to prevent soldering problems including shorting, whereas during assembly there may be tighter spaces for support and wirebonding in the case of a wirebond package. Moreover, half-etching to provide half-etched portions of the leadframe allows the mold compound to provide a mold lock that helps reduce the incidence of mold delamination.

The inner extending terminal pads, such as inner extending terminal pad 131, are not positioned along either of the centerlines 101 and 102 that are shown in FIG. 1A, but are all instead shown having a portion along the diagonals of the leadframe 100 shown as $D_1$ and $D_2$.

Figure 1B:
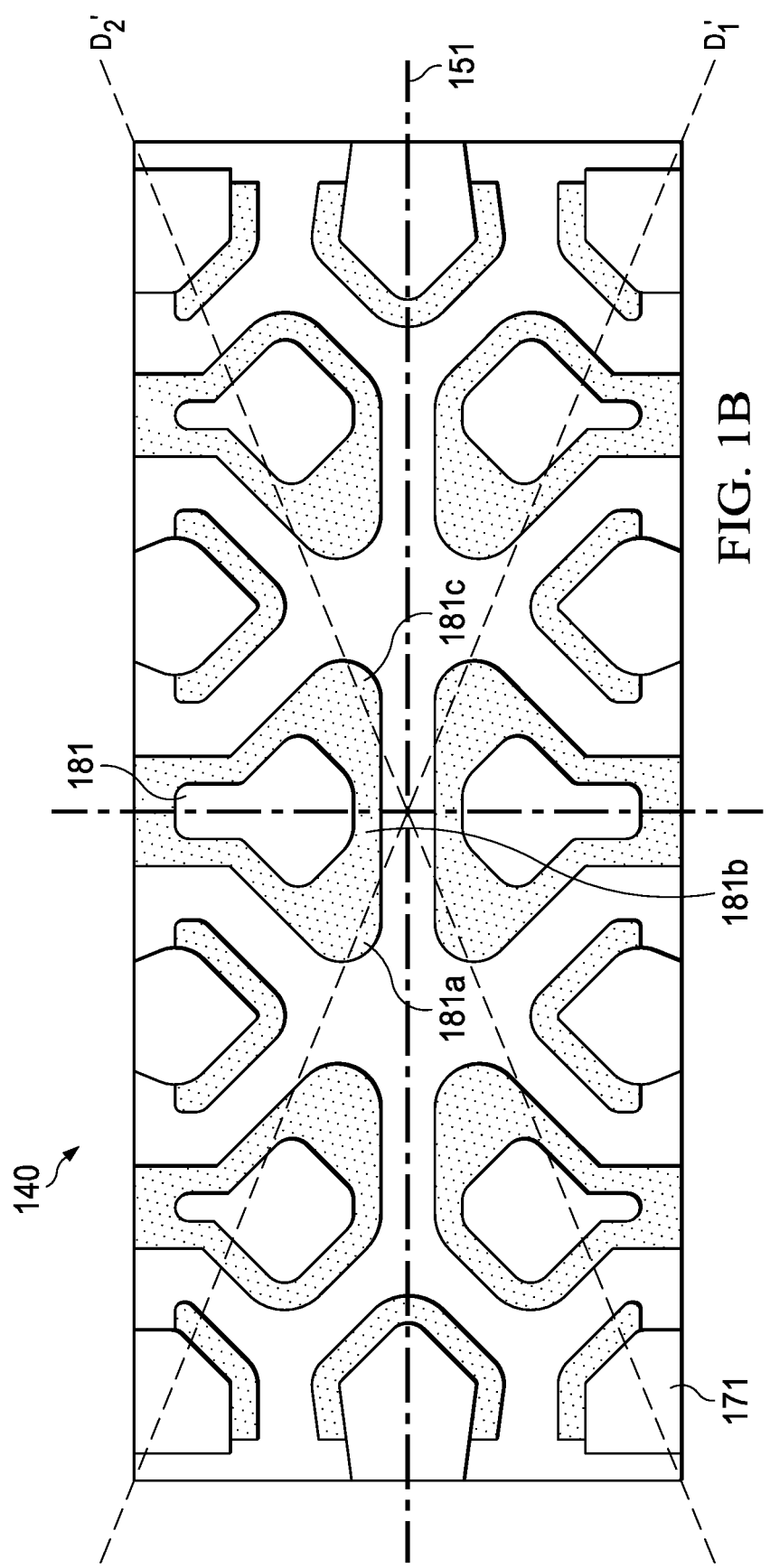
FIG. 1B is a cross-sectional view of an example 16 pin leadframe showing the terminal pads including both and exterior portion terminal pads numbering 10 in total including a terminal pad identified, having full thickness and half-etched portions, according to an example aspect. The inner extending terminal pads including at least one curved portion are not positioned along the horizontal centerline but are all again shown having a portion along a diagonal of the leadframe.

FIG. 1B is a cross-sectional view of an example 16 pin leadframe 140 showing the terminal pads including both and exterior portion terminal pads numbering 10 in total including a terminal pad identified as 171, and inner extending terminal pads numbering 6 in total including an inner extending terminal pad identified as 181, having full thickness and half-etched portions, according to an example aspect. The interior extending terminal pads including the interior extending terminal pad 181 can be seen to include at least one curved portion, with interior extending terminal pad 181 having identified the first curved portion as 181a, the second curved portion identified as 181c, and the straight portion between the first curved portion 181a and the second curved portion 181c identified as 181b.

Each of the 16 terminal pads has full thickness portions and half-etched portions, with half-etched portions again being shown with a dot pattern. The inner extending terminal pads including inner extending terminal pad 181 are not positioned along the horizontal centerline shown as 151, but are all instead again shown having a portion along a diagonal of the leadframe 140 now shown as D' and $D_2'$.

Figure 2:
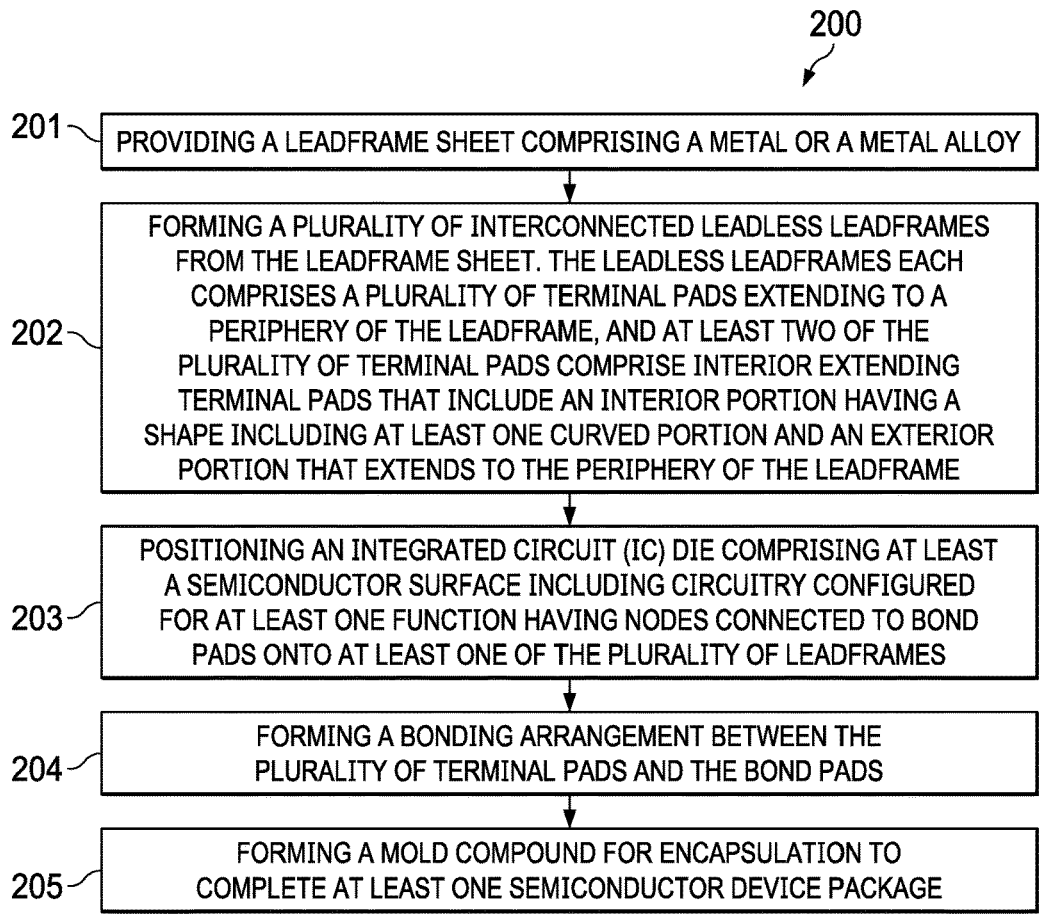
FIG. 2 is a flow chart that shows steps in an example method for forming a leadless semiconductor device package including a disclosed leadless leadframe having a plurality of terminal pads including at least two interior extending terminal pads, according to an example aspect.

FIG. 2 is a flow chart that shows steps in an example method 200 for forming a leadless semiconductor device package including a disclosed leadless leadframe having at least two disclosed interior extending terminal pads, according to an example aspect. Step 201 comprises providing a leadframe sheet (or leadframe panel) comprising a metal or a metal alloy. For example, the metal can comprise copper and the metal alloy can comprise an iron-nickel alloy such as alloy 42. The base metal or metal alloy can also be plated, such as plated with Sn/Ag, or the leadframes can comprise replated copper with a plating such as NiPdAu/Ag plating.

Step 202 comprises forming a plurality of interconnected leadless leadframes from the leadframe sheet. The forming process generally comprises chemical etching. Stamping is also a possible forming process but involves a somewhat more involved process as compared to chemical etching since one will generally also need to perform some coining or secondary etching to provide half-etch areas because one cannot generally stamp out an area that has mold underneath part of the leadframe. This is because when one stamps out a piece of metal, a solid block is obtained so that one cannot generally stamp out a half-etch feature. In contrast, using chemical etching, one can control the amount of chemical applied, so one can apply a suitable chemical etchant to only one side of the metal and wash away the etchant once it etches about half the thickness of the metal, thus providing a half-etched feature.

Regarding chemical etching for disclosed metal patterning of leadframes, chemical etching is a conventional method for the manufacture of leadframes. Etched leadframes are manufactured in flat sheets comprising generally copper or an iron-nickel alloy that provide a low expansion rate at room temperature. Both sides of the flat sheets are generally cleaned and then laminated with photoresist. The photoresist is then exposed to provide the desired leadframe pattern with the aid of an ultraviolet (UV) light source and a precision pattern film. Photoresist is then developed over the areas of the leadframe that are to be etched away, with the remaining photoresist protecting the parts during the etching process.

To obtain both full thickness and half-etched region using chemical etching one can pattern the top and bottom side of the leadframe differently. A suitable chemical can be applied such as by spraying over the top and bottom of the leadframe and one can control the rate/time at which the chemical etches areas of the leadframe. The overlap of both the top and bottom pattern photoresist on the leadframe will etch out a hole in the leadframe, where areas outside the photoresist on only the top side of the leadframe will etch out half the leadframe. Finally, the photoresist is stripped from the finished leadframes, before the etched panels are singulated into strips, or supplied in sheet form facilitate handling depending upon customer requirements. The cut leadframe strips are cleaned and plated and can be plated with a metal such as silver to facilitate wire bonding.

As described above stamping can also be used as an alternative to etching for metal patterning to provide lead terminals. One can 'coin' the leadframe which is flattening the metal somewhat. Stamping is an automated, high-speed process suitable for large production rates. The sheet metal, typically in roll form, is pierced along both edges to create indexing holes that position the metal sheet during further processing. The location holes are used to advance the sheet metal strip through a stamping machine. Die-and-punch sets specific to the leadframe geometry are generally also needed. The stamping process is typically accomplished by a series of stamping operations that progressively approach the final lead or lead terminal geometry, the number of steps being largely dependent on the complexity of the geometry of the leadframe.

Result after step 202 comprises the leadless leadframes in the leadframe sheet each comprising a plurality of terminal pads extending to a periphery of the leadframe, with at least two of the plurality of terminal pads comprise interior extending terminal pads. As described above and shown in FIGS. 1A and 1B the interior extending terminal pads include an interior portion having a shape including at least one curved portion and an exterior portion that extends to the periphery of the leadframe.

Step 203 comprises positioning an IC die comprising at least a semiconductor surface including circuitry configured for at least one function having nodes connected to bond pads onto at least one leadframe, which is generally a plurality of leadframes in the form of a leadframe sheet. A conventional pick and place operation can be used for step 203.

Step 204 comprises forming a bonding arrangement between the plurality of terminal pads and the bond pads. In the case of a wirebond package the bonding arrangement comprises bondwires, while for a flipchip package the bonding arrangement generally comprises a solder joint. Step 205 comprises forming a mold compound for providing encapsulation to complete at least one semiconductor device package. Solder is generally then applied on the bottom of the package after the molding, then singulation generally follows. Solder placement and mounting generally take place at a customer's facility. As described above, in the typical case of processing a leadframe sheet, singulation results in a plurality of disclosed semiconductor package devices.

Figure 3:
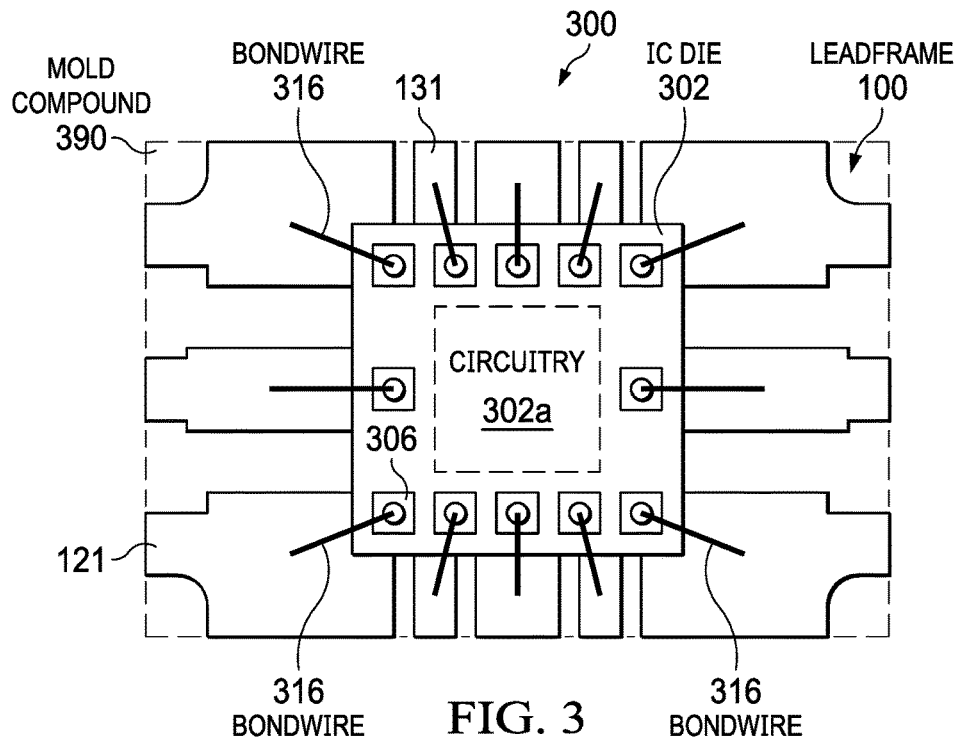
FIG. 3 depicts a top perspective see-through the mold view of a semiconductor device package including the leadless leadframe shown in FIG. 1A showing an IC die having bond pads attached to the leadframe and bondwires connected between the bond pads and the terminal pads of the leadframe, and a mold compound providing encapsulation for the semiconductor device package.

FIG. 3 is a perspective see-through the mold view of a semiconductor device package 300 including the leadless leadframe 100 shown in FIG. 1A comprising an IC die 302 having bond pads 306 attached to the leadframe 100, and bondwires 316 connected between the bond pads 306 and the terminal pads of the leadframe 100, according to an example aspect. The same terminal pads in FIG. 3 are also identified by the same reference number as in FIG. 1A, being a terminal pad 121 comprising a conventional terminal pad and inner extending terminal pad 131. A mold compound 390 is shown that encapsulates the package to provide the semiconductor device package 300. The IC die 302 includes circuitry shown as 302a which comprises circuit elements (including transistors, and generally diodes, resistors, capacitors, etc.) that may be formed in an epitaxial layer on a bulk substrate material such as silicon configured together for generally realizing at least one circuit function. Example circuit functions include analog (e.g., amplifier or power converter), radio frequency (RF), digital, or non-volatile memory functions.

Figure 4:
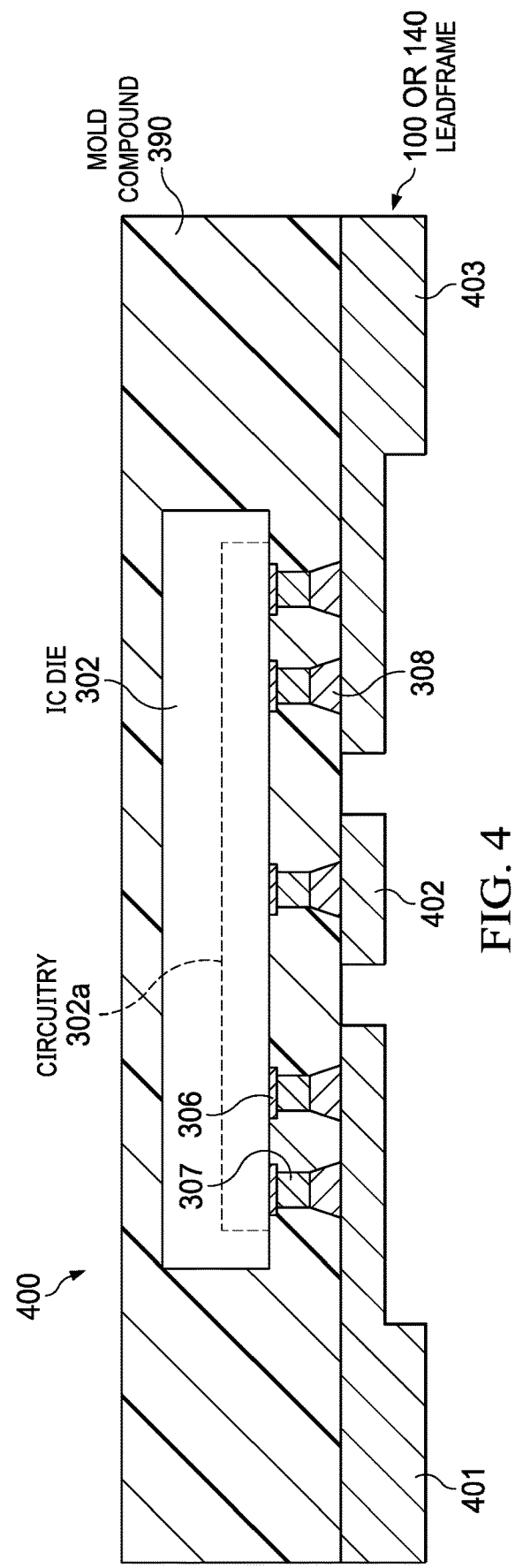
FIG. 4 depicts a cross-sectional view of a flipchip on lead (FCOL) plastic QFN package including a disclosed leadless leadframe with an IC die having bond pads flipchip attached to the leadframe.

FIG. 4 depicts a cross-sectional view of a FCOL plastic QFN package 400 comprising a disclosed leadless leadframe 100 or 140, with an IC die 302 including circuitry 302a having bond pads 306 flipchip attached to the leadframe, according to an example aspect. There is a solder joint 308 between metal posts 307, such as copper pillars, on the bond pads 306 of the IC die 302 and the leads of the leadframe are shown as 401, 402, and 403. The mold compound is again shown as 390.

Disclosed leadframes generally satisfy the minimum solder stencil aperture constraint, and can generally retain at least a 0.4 mm pitch. The term 'pitch' as used herein is the lead terminal to lead terminal spacing, usually taken as a center point to center point of the lead terminal shape. Disclosed interior extending terminal pads as described above are generally not along any of the centerlines of the leadframe. Disclosed leadframes can use only one tie bar for each terminal pad, although this is not required. Inward extending portions of the disclosed interior portion having a shape including at least one curved portion provides greater wire bonding support for wirebonded packages, and are not in the solder stencil. Disclosed aspects can be expanded to higher pin counts and shown in the FIGS., described above, such as up to about 24 pins.

Examples

Disclosed aspects are further illustrated by the following specific Examples, which should not be construed as limiting the scope or content of this Disclosure in any way.

Copied below is a table showing semiconductor device package area reductions using disclosed leadframe designs including disclosed interior extending terminal pads for 10, 12, and 16 pin QFN leadframes as compared to a believed to be a current smallest conventional QFN package that has only periphery terminal pads.

| Number of pins | area reduction % |
|---|---|
| 10 pins | 32% |
| 12 pins | 34% |
| 16 pins | 45% |

Disclosed aspects can be integrated into a variety of assembly flows to form a variety of different semiconductor IC devices and related products. The assembly can comprise a single IC die or multiple IC die, such as configurations comprising a plurality of stacked IC die. A variety of package substrates may be used. The IC die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. A leadframe, comprising:
a plurality of terminal pads extending to a periphery of the leadframe; and
at least two of the plurality of terminal pads comprising interior extending terminal pads that include an interior portion, for attaching to a semiconductor die, having a shape including at least one curved portion and an exterior portion that extends to the periphery of the leadframe, wherein at least a portion of the interior portion of the interior extending terminal pads includes a half-etched region, and wherein for the interior extending terminal pads, the half-etched region completely encircles a full thickness region.

2. The leadframe of claim 1, wherein the interior portion of each of the at least two of the plurality of terminal pads is positioned along a diagonal of the leadframe.

3. The leadframe of claim 1, wherein the leadframe is configured for a wirebond package.

4. The leadframe of claim 1, wherein the leadframe is configured for a flipchip package.

5. The leadframe of claim 1, where the leadframe comprises a quad flat no-lead (QFN) leadframe.

6. The leadframe of claim 1, wherein the curved portion includes a first curved portion and a second curved portion spaced apart from the first curved portion.

7. A leadframe, comprising:
a plurality of terminal pads extending to a periphery of the leadframe; and
at least two of the plurality of terminal pads comprising interior extending terminal pads that include an interior portion and an exterior portion that extends to the periphery of the leadframe, the interior portion having a shape including at least one curved portion planar to a surface of the interior extending terminal pads;
wherein the interior portion of each of the interior extending terminal pads is positioned along a diagonal of the leadframe.

8. A leadframe, comprising:
a plurality of terminal pads extending to a periphery of the leadframe; and
at least two of the plurality of terminal pads comprising interior extending terminal pads that include an interior portion and an exterior portion that extends to the periphery of the leadframe, the interior portion having a shape including at least one curved portion planar to a surface of the interior extending terminal pads;
wherein at least a portion of the interior portion includes a half-etched region that extends to the periphery of the leadframe and that completely encircles a full thickness region.

9. A leadframe, comprising:
a plurality of terminal pads extending to a periphery of the leadframe; and
at least two of the plurality of terminal pads comprising interior extending terminal pads that include an interior portion and an exterior portion that extends to the periphery of the leadframe, the interior portion having a shape including at least one curved portion and having a larger surface area compared to a surface area of the exterior portion;
wherein the interior extending terminal pads have a larger area as compared to others of the plurality of terminal pads.

10. A semiconductor device package, comprising:
a plurality of terminal pads extended to a periphery of the semiconductor device package, wherein
at least two of the plurality of terminal pads are interior extending terminal pads that include an interior portion having a shape including at least one curved portion and an exterior portion that extends to the periphery of the semiconductor device package;
an integrated circuit (IC) die comprising at least a semiconductor surface including circuitry configured for at least one function, the circuitry connected to bond pads on the semiconductor surface, the IC die and the bond pads disposed on the interior portions of the interior extending terminal pads;
a bonding arrangement between the plurality of terminal pads and the bond pads; and
a mold compound for encapsulation of the semiconductor device package.

11. The semiconductor device package of claim 10, wherein the bonding arrangement comprises bondwires between the exterior portion of the plurality of terminal pads and the bond pads.

12. The semiconductor device package of claim 10, wherein the semiconductor device package comprises a flipchip package and wherein the bonding arrangement comprises a solder joint.

13. The semiconductor device package of claim 10, wherein the interior portion of each of the at least two of the plurality of terminal pads is positioned along a diagonal of the semiconductor device package.

14. The semiconductor device package of claim 10, wherein at least a portion of the interior portion includes a half-etched region.

15. The semiconductor device package of claim 14, wherein, for the interior extending terminal pads, the half-etched region completely encircles a full thickness region.

16. The semiconductor device package of claim 10, wherein the curved portion includes a first curved portion and a second curved portion spaced apart from the first curved portion.

17. The semiconductor device package of claim 10, wherein at least a portion of the exterior portion includes a half-etched region that extends to the periphery of the semiconductor device package.

18. The semiconductor device package of claim 10, wherein the at least one curved portion of the interior portion includes a half-etched region.

19. The semiconductor device package of claim 10, wherein the semiconductor device package is a quad flat no-lead (QFN) package.

20. The semiconductor device package of claim 10, wherein the interior portion has a larger surface area compared to a surface area of the exterior portion.

21. The semiconductor device package of claim 10, wherein the interior extending terminal pads have a larger area as compared to others of the plurality of terminal pads.

22. A method, comprising:
providing a leadframe sheet comprising a metal or a metal alloy; and
forming a plurality of interconnected leadframes from the leadframe sheet, the leadframes each comprising:
a plurality of terminal pads extending to a periphery of the interconnected leadframe,
wherein at least two of the plurality of terminal pads comprising interior extending terminal pads that include an interior portion, for attaching to an integrated circuit (IC) die, having a shape including at least one curved portion and an exterior portion that extends to the periphery of the interconnected leadframe, wherein at least a portion of the interior portion of the at least two of the plurality of terminal pads includes a half-etched region, and wherein for the interior extending terminal pads, the half-etched region completely encircles a full thickness region.

23. The method of claim 22, wherein forming the interconnected leadframes comprises chemical etching including formation of the half-etched regions.

24. The method of claim 22, wherein forming the interconnected leadframes comprises stamping.

25. The method of claim 22, further comprising:
positioning the IC die that comprises at least a semiconductor surface including circuitry configured for at least one function, the circuitry connected to bond pads, onto at least one of the plurality of the interconnected leadframes, wherein positioning the IC die comprises positioning the IC die on the interior portion of the interior extending terminal pads;
forming a bonding arrangement between the plurality of terminal pads and the bond pads; and
forming a mold compound for encapsulation to complete a semiconductor device package.

26. The method of claim 25, wherein positioning the IC die comprises flipchip positioning.

27. The method of claim 25, wherein positioning the IC die comprises face up positioning of the IC die.

28. A semiconductor device package, comprising:
a plurality of terminal pads extended to a periphery of the semiconductor device package, wherein at least two of the plurality of terminal pads are interior extending terminal pads that include an interior portion having a shape with at least one curved portion and an exterior portion that extends to the periphery of the semiconductor device package;
an integrated circuit (IC) die including circuitry for realizing at least one function, the circuitry connected to bond pads on the IC die, the IC die disposed on the interior portions of the interior extending terminal pads; and
a mold compound for encapsulation of the semiconductor device package.

29. The semiconductor device package of claim 28, the semiconductor device package, further comprising:
bondwires between the plurality of terminal pads and the bond pads.

30. The semiconductor device package of claim 28, the semiconductor device package, further comprising:
solder joints between the plurality of terminal pads and the bond pads.

31. The semiconductor device package of claim 28, wherein the interior portion of each of the interior extending terminal pads is positioned along a diagonal of the semiconductor device package.

32. The semiconductor device package of claim 28, wherein the interior portion includes a half-etched region that circumscribes a full thickness region of the interior portion.

33. The semiconductor device package of claim 28, wherein the shape of the interior portion has a straight portion conjoined to the at least one curved portion.

34. The semiconductor device package of claim 28, wherein at least a portion of the exterior portion includes a half-etched region that extends to the periphery of the semiconductor device package.

35. The semiconductor device package of claim 28, wherein the at least one curved portion of the interior portion includes a half-etched region.

36. The semiconductor device package of claim 28, wherein the semiconductor device package is a quad flat no-lead (QFN) package.

37. The semiconductor device package of claim 28, wherein the interior portion has an area greater than the exterior portion.

38. The semiconductor device package of claim 28, wherein the interior extending terminal pads have an area greater than others of the plurality of terminal pads.

* * * * *